United States Patent
Wu et al.

(10) Patent No.: US 7,521,330 B2
(45) Date of Patent: Apr. 21, 2009

(54) METHODS FOR FORMING CAPACITOR STRUCTURES

(75) Inventors: Chun Chieh Wu, Hsinchu (TW); Chi-Feng Huang, Ping-Tung (TW); Chun-Hung Chen, Jhubei (TW); Chih-Ping Chao, Hsin-Chu (TW); John Chern, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/757,763

(22) Filed: Jun. 4, 2007

(65) Prior Publication Data

US 2008/0299723 A1 Dec. 4, 2008

(51) Int. Cl.
*H01L 21/20* (2006.01)

(52) U.S. Cl. ............... 438/396; 438/210; 438/239; 257/86; 257/7; 257/296; 257/535

(58) Field of Classification Search ............ 257/86, 257/7, 296, 300, 535, E21.351, E21.364, 257/E21.653, E27.017, E27.019, E27.034, 257/E27.093; 438/210, 239, 396
See application file for complete search history.

(56) References Cited

U.S. PATENT DOCUMENTS

| | | | | |
|---|---|---|---|---|
| 4,391,032 A | * | 7/1983 | Schulte | 438/251 |
| 4,466,177 A | * | 8/1984 | Chao | 438/251 |
| 5,989,948 A | * | 11/1999 | Vines et al. | 438/216 |
| 6,057,203 A | * | 5/2000 | Wong | 438/381 |
| 6,057,572 A | * | 5/2000 | Ito et al. | 257/296 |
| 6,063,659 A | | 5/2000 | Le | |
| 6,215,142 B1 | * | 4/2001 | Lee et al. | 257/301 |
| 6,395,596 B1 | * | 5/2002 | Chien et al. | 438/241 |
| 6,403,417 B1 | * | 6/2002 | Chien et al. | 438/241 |
| 6,461,919 B1 | * | 10/2002 | Shibata | 438/275 |
| 6,468,867 B1 | * | 10/2002 | Lai et al. | 438/275 |
| 6,495,416 B1 | * | 12/2002 | Ito et al. | 438/251 |
| 6,559,055 B2 | * | 5/2003 | Tuan et al. | 438/692 |
| 6,596,587 B1 | * | 7/2003 | Mehta | 438/257 |
| 6,764,930 B2 | | 7/2004 | Chu et al. | |
| 2004/0004246 A1 | * | 1/2004 | Anezaki | 257/315 |
| 2004/0238898 A1 | * | 12/2004 | Ohgishi | 257/379 |
| 2005/0221556 A1 | * | 10/2005 | Futatsugi et al. | 438/239 |
| 2006/0172488 A1 | * | 8/2006 | Fujishima et al. | 438/250 |

* cited by examiner

*Primary Examiner*—N Drew Richards
*Assistant Examiner*—Ankush k Singal
(74) *Attorney, Agent, or Firm*—Duane Morris LLP (57) ABSTRACT

A method for forming a capacitor includes forming a dielectric layer over a substrate. A conductive layer is formed over the dielectric layer. Dopants are implanted through at least one of the dielectric layer and the conductive layer after forming the dielectric layer so as to form a conductive region under the dielectric layer, wherein the conductive layer is a top electrode of the capacitor and the conductive region is a bottom electrode of the capacitor.

20 Claims, 11 Drawing Sheets

METHODS FOR FORMING CAPACITOR STRUCTURES

BACKGROUND OF THE INVENTION

1. Field of the Invention

The present invention relates to methods for forming semiconductor structures, and more particularly to methods for forming capacitor structures.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been proposed and are being used along with techniques for overcoming manufacturing obstacles associated with these materials and requirements. Further, high-linearity metal-oxide-semiconductor (MOS) capacitors and methods for forming MOS capacitors have been proposed to form capacitors during a front-end process, i.e., before the formation of an inter layer dielectric (ILD) layer.

Figure 1:
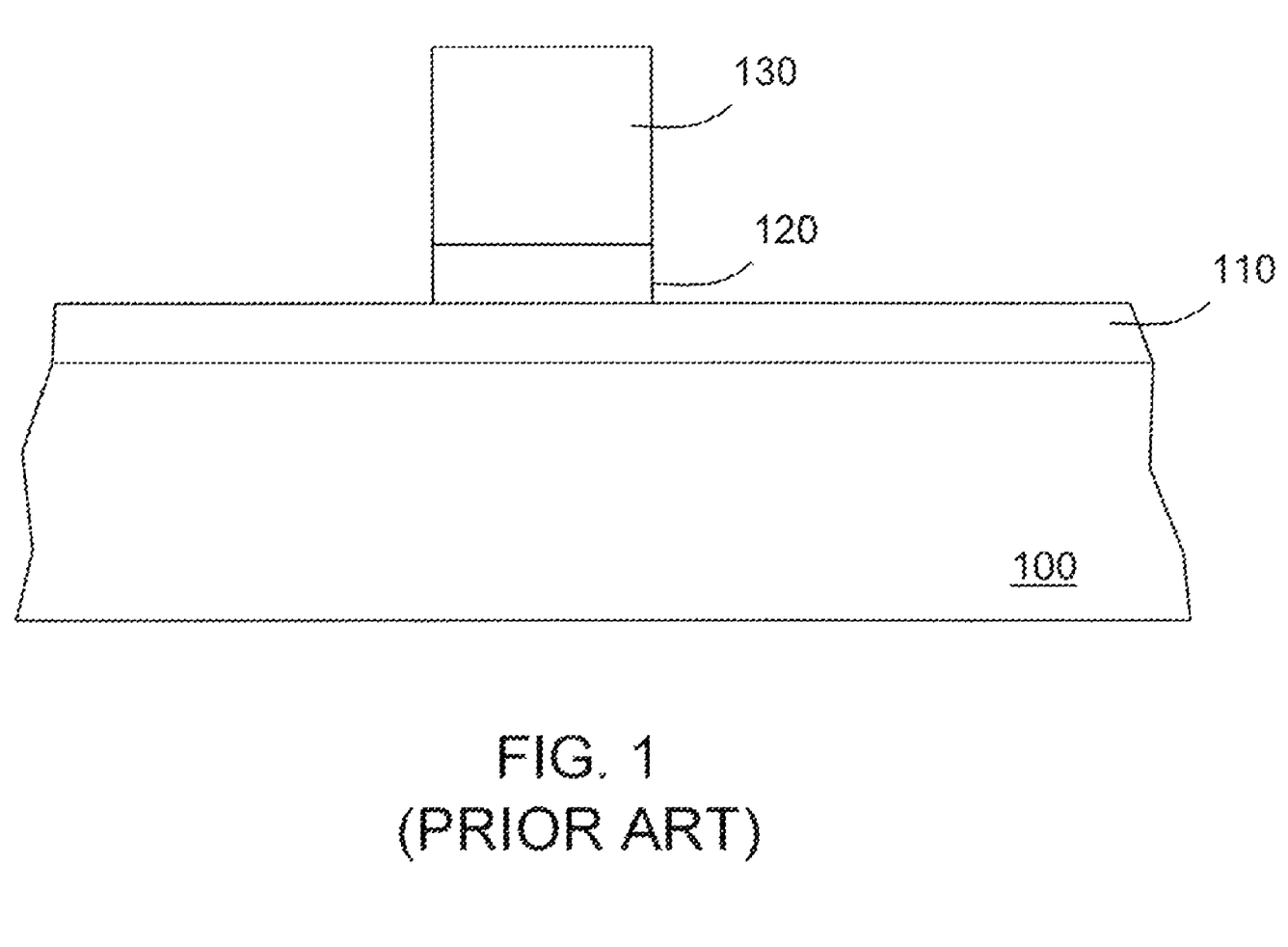
FIG. 1 is a cross-sectional view of a traditional high-linearity metal-oxide-semiconductor (MOS) capacitor.

FIG. 1 is a cross-sectional view of a traditional high-linearity metal-oxide-semiconductor (MOS) capacitor. A blank silicon substrate 100 is provided. An implantation process is conducted so as to form a bottom electrode 110 within the blank silicon substrate 100. After implanting dopants within the bottom electrode 110, an oxide layer 120 is formed over the bottom electrode 110. A polysilicon layer 130 is then formed over the oxide layer 120. The oxide layer 120 and the polysilicon layer 130 are a capacitor dielectric layer and a top electrode of a capacitor, respectively.

SUMMARY OF THE INVENTION

In accordance with some exemplary embodiments, a method for forming a capacitor includes forming a dielectric layer over a substrate. A conductive layer is formed over the dielectric layer. Dopants are implanted through at least one of the dielectric layer and the conductive layer after forming the dielectric layer so as to form a conductive region under the dielectric layer, wherein the conductive layer is a top electrode of the capacitor and the conductive region is a bottom electrode of the capacitor.

The above and other features will be better understood from the following detailed description of the exemplary embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DETAILED DESCRIPTION OF EXEMPLARY EMBODIMENTS

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

FIGS. 2A-2G are schematic cross-sectional views showing an exemplary method for forming an exemplary capacitor and a field effect transistor (FET).

Figure 2A:
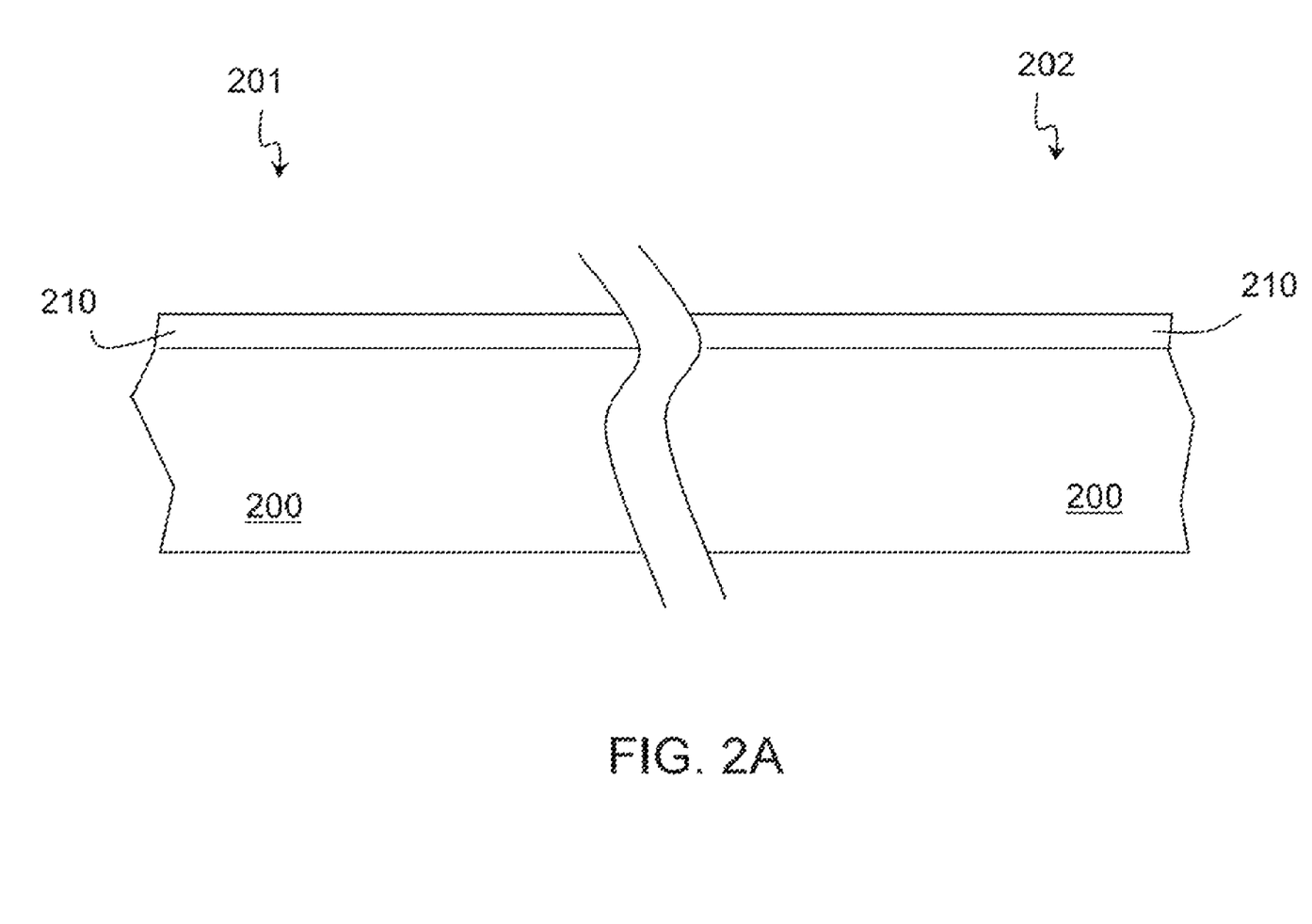
FIGS. 2A-2G are schematic cross-sectional views showing an exemplary method for forming an exemplary capacitor and a field effect transistor (FET).

Referring to FIG. 2A, at least one dielectric layer such as dielectric layer 210 is formed over a substrate 200. The substrate 200 may include at least one capacitor region 201 and at least one transistor region 202. The capacitor region 201 is predefined and provided for forming at least one capacitor (not shown) therein. The transistor region 202 is predefined and provided for forming at least one transistor (not shown) therein.

The substrate 200 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, at least one diode, transistor, device, circuit or other semiconductor structure or various combinations thereof (not shown) are formed below the dielectric layer 210 and may be electrically coupled to each other.

In some embodiments, the dielectric layer 210 may be generally referred to as a gate dielectric layer. The dielectric layer 210 may include a silicon oxide layer, a silicon nitride layer, a silicon oxynitride layer, a high-k dielectric layer containing a material such as $HfO_2$, $HfSiO_4$, $ZrO_2$, $ZrSiO_4$, $Ta_2O_5$, HfSiON or the like, a multiple-layer structure or various combinations thereof. In some embodiments, the dielectric layer 210 may be formed by, for example, a thermal oxidation process, a chemical vapor deposition (CVD) process, an epitaxy process, other suitable processes, or various combinations thereof. For some embodiments using 65-nm technology, the dielectric layer 210 may have a thickness between about 16 angstroms (Å) and about 70 Å. Other dimensions of the thickness of the dielectric layer 210 may be used in different semiconductor manufacturing technology.

Figure 2B:
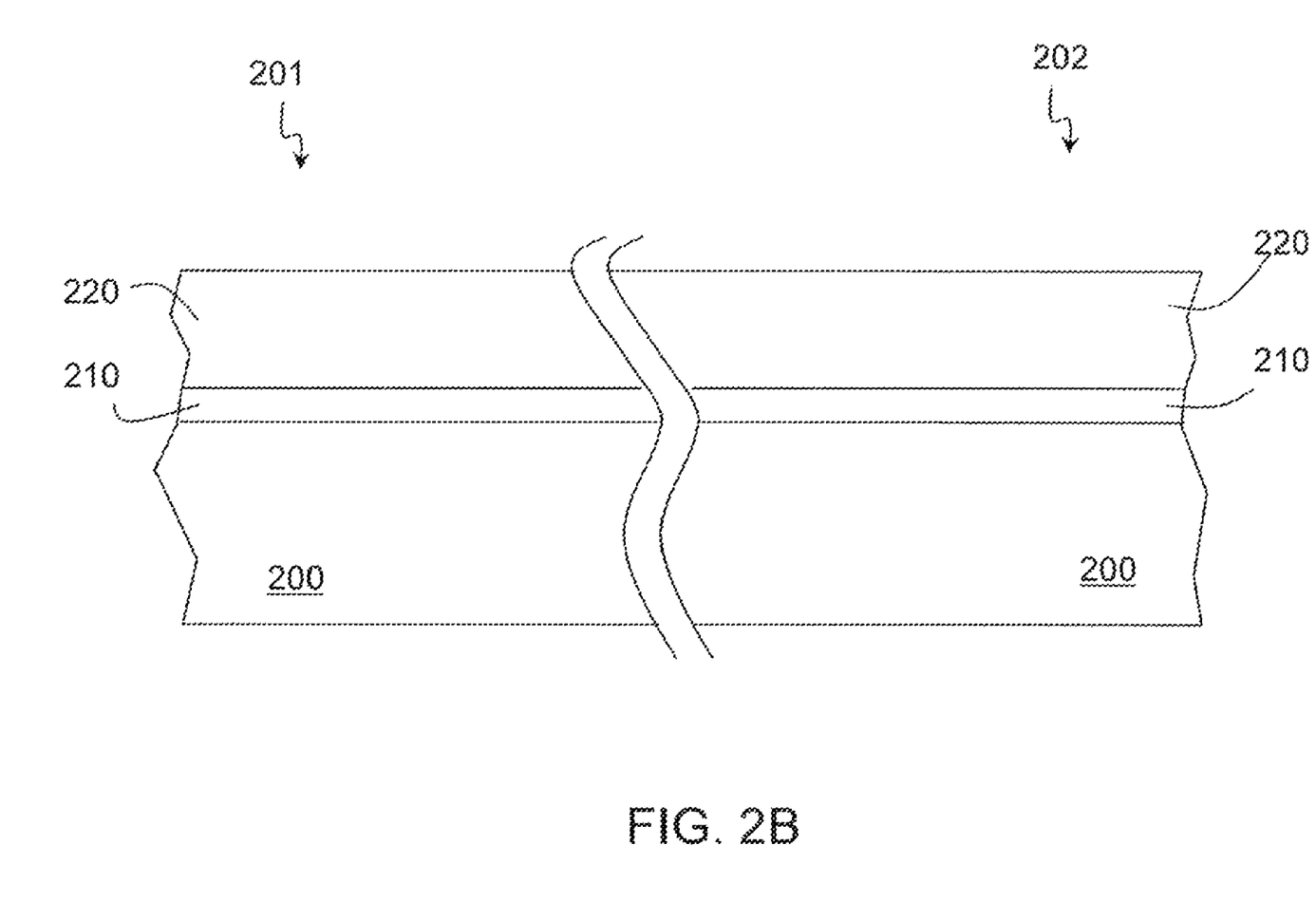

Referring to FIG. 2B, a conductive layer 220 is formed over the dielectric layer 210. The conductive layer 220 may comprise, for example, a silicon layer, a polysilicon layer, an amorphous silicon layer, a SiGe layer, a conductive material layer, a metallic layer, other suitable layers, or various combinations thereof. In some embodiments, the conductive layer 220 may be formed by, for example, a CVD process but other suitable formation processes may alternatively be used. For some embodiments using 65-nm technology, the conductive layer 220 may have a thickness between about 1000 angstroms (Å) and about 2000 Å. In other embodiments using 65-nm technology, the conductive layer 220 may have a thickness of about 1,000 Å. Other dimensions of the thickness of the conductive layer 220 may be used in different semiconductor manufacturing technology.

Figure 2C:
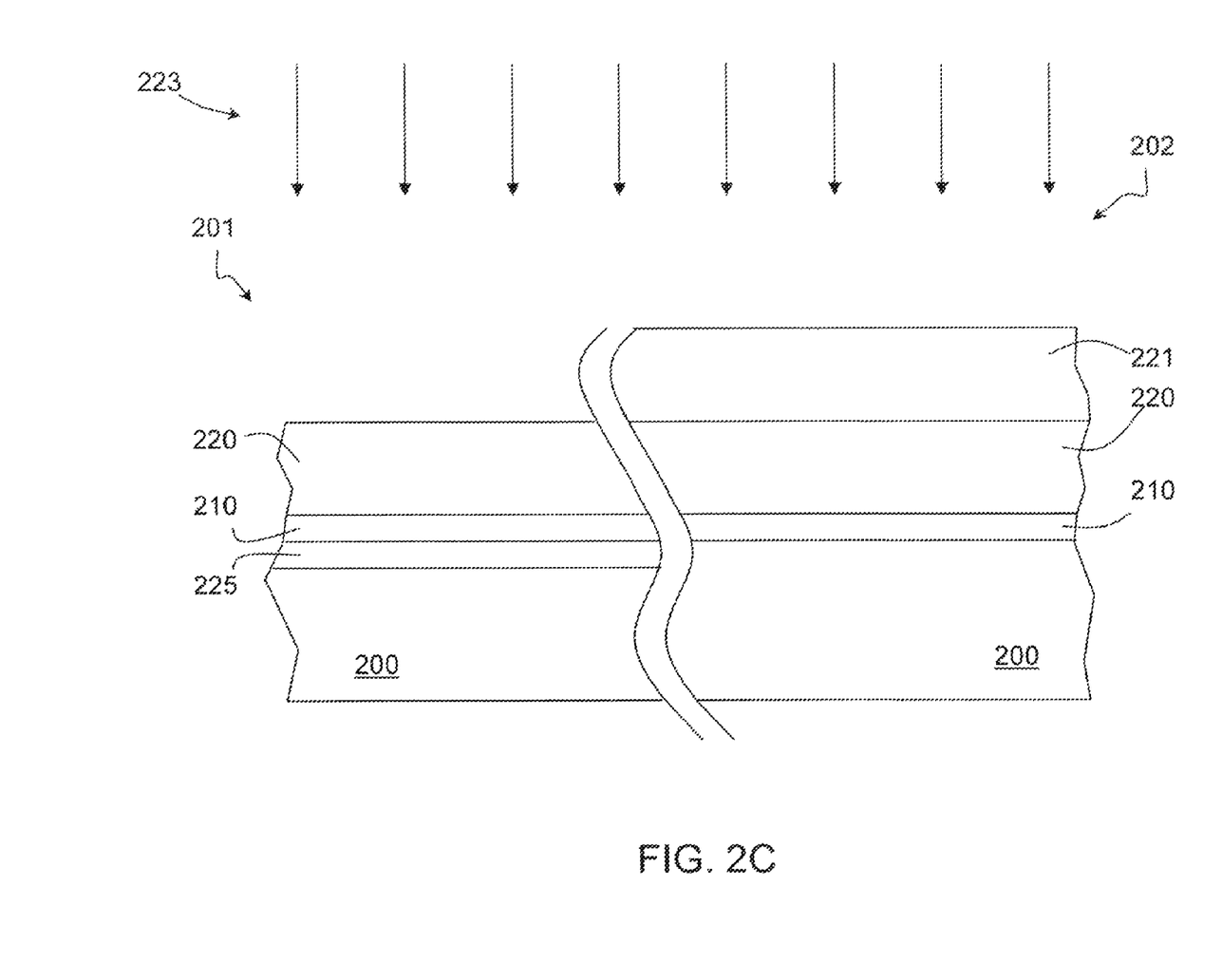

Referring to FIG. 2C, a patterned photoresist layer 221 is formed over the conductive layer 220, at least partially covering the transistor region 202 and at least partially exposing the capacitor region 201. The patterned photoresist layer 221 is formed to protect the transistor region 202 from an ion implantation process 223. Accordingly, no dopant of the ion implantation process 223 is formed in the transistor region 202 of the substrate 200.

After forming the patterned photoresist layer 221, the ion implantation process 223 is conducted, such that ions penetrate through the dielectric layer 210 and the conductive layer 220 into the substrate 200 so as to form a conductive region 225 within the capacitor region 201 of the substrate 200. In some embodiments, the conductive region 225 may be referred to as a bottom electrode of a capacitor (not shown).

The ion implantation process 223 may use boron, phosphorus, arsenic or other dopant. In some embodiments, the ion implantation process 223 may have an implantation energy between about 5 KeV and about 200 KeV. The ion implantation process 223 may have an implantation dosage between about $1 \times 10^{14}/cm^2$ and about $1 \times 10^{17}/cm^2$. In other embodiments, the ion implantation process 223 may have an implantation energy of about 70 KeV and an implantation dosage of about $2.5 \times 10^{15}/cm^2$.

Referring again to FIG. 1, the oxide layer 120 is formed after the ion implantation for forming the region 110. It is found that the dopants within the bottom electrode 110 may diffuse out during the thermal process for forming the oxide layer 120. The out diffusion of the dopants may contribute to the formation of the oxide layer 120 and the thickness of the oxide layer 120 may be undesirably increased. For example, the thickness of the oxide layer 120 of the capacitor may be about 1.5 times as thick as a gate oxide layer of a core metal-oxide-semiconductor (MOS) transistor or an input/output (I/O) MOS transistor (not shown) formed over the substrate 100. Accordingly, the electrical features of the capacitor shown in FIG. 1 may deviate from pre-defined electrical characters.

Referring again to FIG. 2C, the ion implantation process 223 is conducted after the formation of the dielectric layer 210. Since the dopants within the conductive region 225 are implanted after the formation of the dielectric layer 210, no conductive region is formed in the capacitor region 201 and the transistor region 202 of the substrate 200 before the formation of the dielectric layer 210. Without the conductive region 225, the portion of the dielectric layer 210 formed within the capacitor region 201 may have a thickness substantially equal to that of the portion of the dielectric layer 210 formed within the transistor region 202. In some embodiments using 65-nm technology, the thickness of the portion of the dielectric layer 210 formed within the capacitor region 201 may be between about 0.95 and about 1.05 times as thick as that of the portion of dielectric layer 210 formed within the transistor region 202.

After the ion implantation process 223, the patterned photoresist layer 221 may be removed by a photoresist removal process including a dry etch process and/or a wet etch process.

Figure 2D:
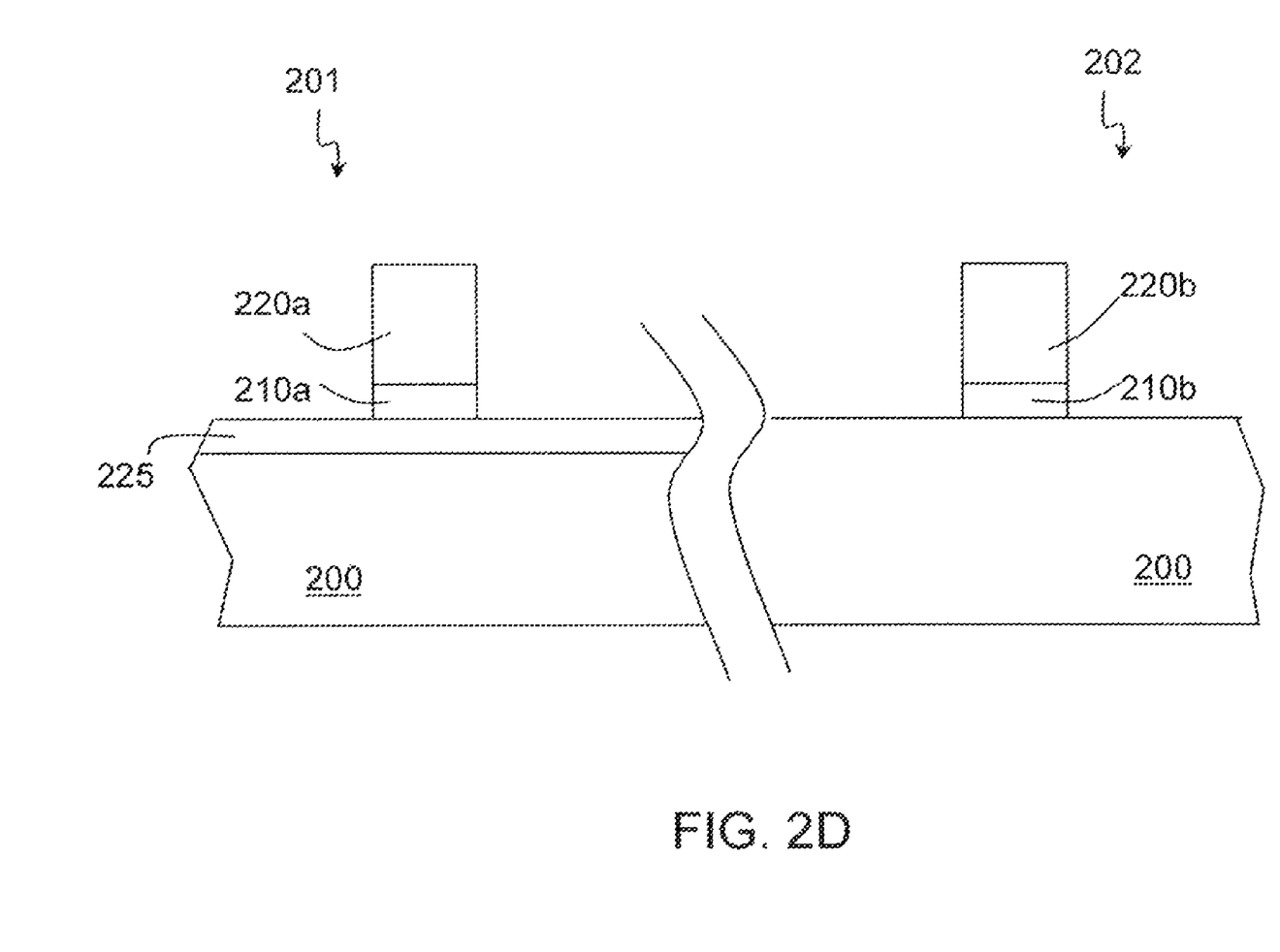

Referring to FIG. 2D, the conductive layer 220 and the dielectric layer 210 may be subjected to an etch process so as to define the top electrode 220a, the dielectric layer 210a of a capacitor and the gate dielectric layer 210b, the gate 220b of a transistor. The patterning (of the top electrode 220a and the dielectric layer 210a of a capacitor and the gate dielectric layer 210b and the gate 220b of a transistor) may include forming a patterned photoresist layer (not shown) over the conductive layer 220 corresponding to the patterns of the top electrode 220a, the dielectric layer 210a of a capacitor and the gate dielectric layer 210b, the gate 220b of a transistor. An etch process is then conducted to remove the portions of the conductive layer 220 and the dielectric layer 210 that are not covered by the patterned photoresist layer (not shown). After the etch process, the patterned photoresist layer is removed by a photoresist removal process.

In some embodiments, the dielectric layer 210a and the gate dielectric layer 210b are formed by the same dielectric layer formation process. In other embodiments, the dielectric layer 210a and the gate dielectric layer 210b may be formed by different dielectric layer formation processes.

In some embodiments, the top electrode 220a and the gate 220b are formed by the same film layer formation process. In other embodiments, the top electrode 220a and the gate 220b may be formed by different film layer formation processes.

Figure 2E:
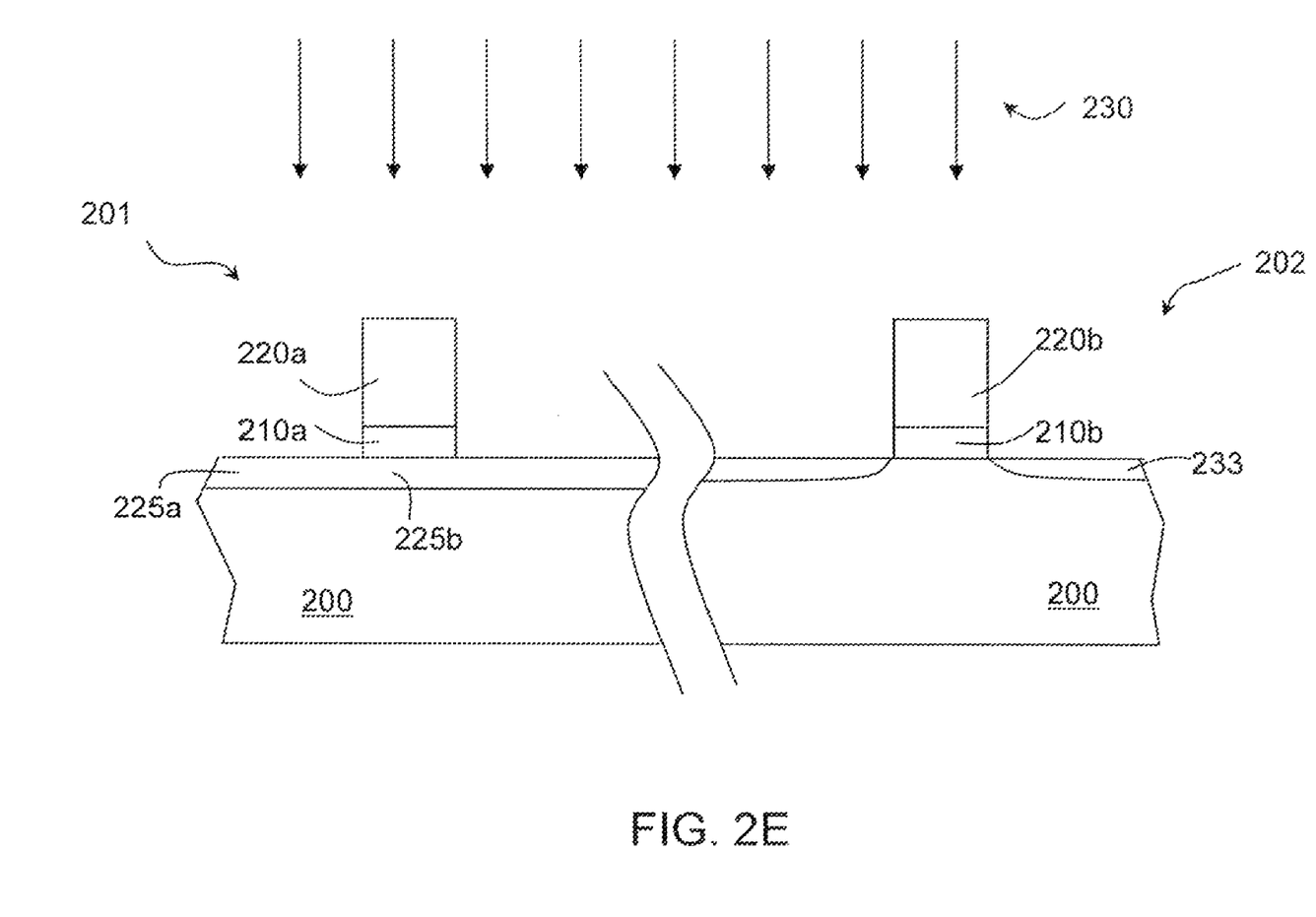

Referring to FIG. 2E, an ion implantation process 230 is conducted to form conductive regions 233 within the substrate 200 near to the dielectric layer 210b. In some embodiments, the ion implantation process 230 is referred to as a lightly-doped drain (LDD) implantation. The ion implantation process 230 may increase the dopant concentration within the top electrode 220a and the conductive region 225a, which are not covered by the top electrode 220a. Accordingly, the conductivity of the top electrode 220a and the conductive region 225a may be desirably increased. The dopant concentration within the region 225b covered by the top electrode 220a may be substantially equal to the dopant concentration of the region 225 (shown in FIG. 2D).

Figure 2F:
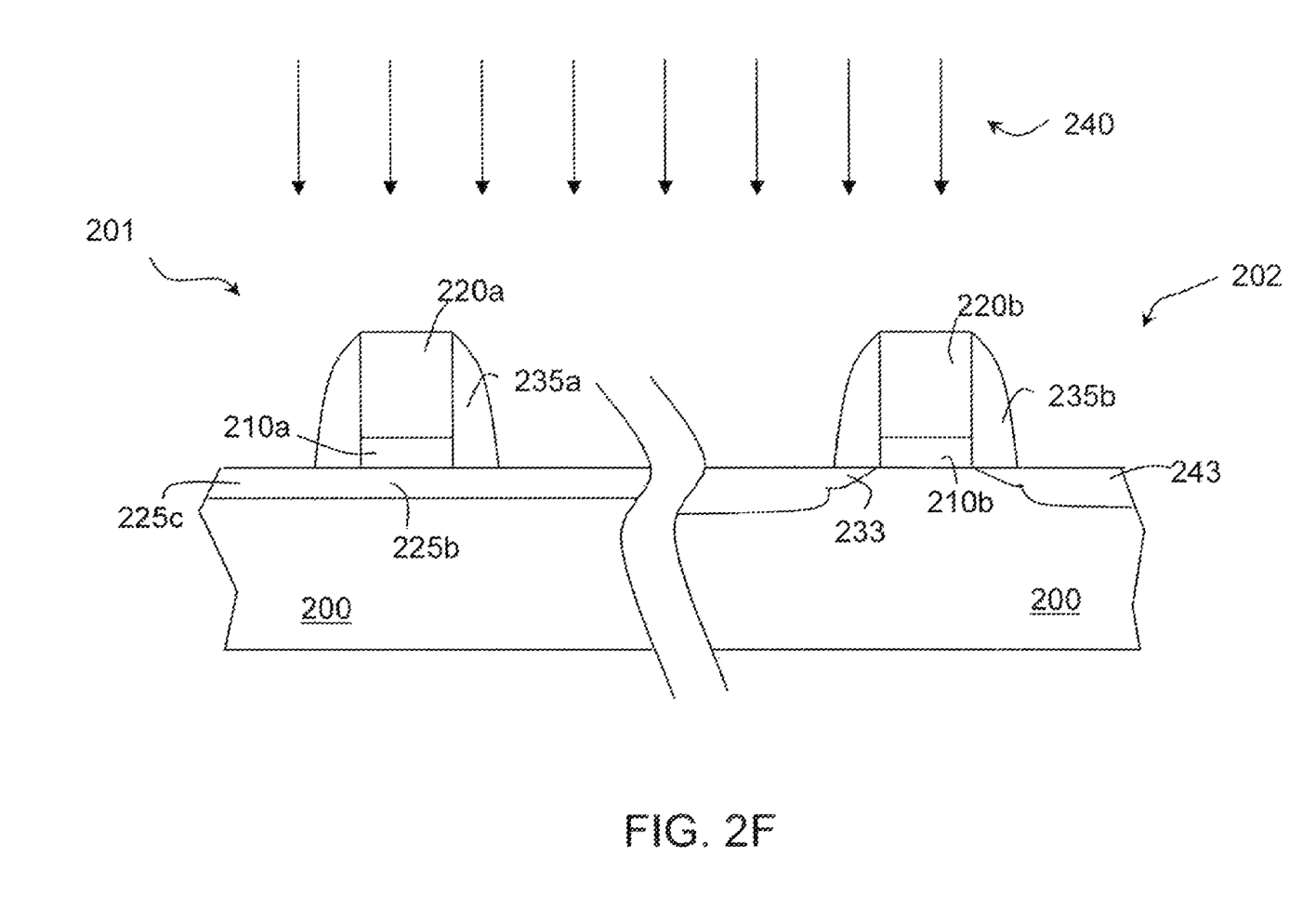

Referring to FIG. 2F, at least one spacer such as spacers 235a and 235b are formed on the sidewalls of the top electrodes 220a and the gate 220b, respectively. The spacers 235a and 235b may include, for example, at least one dielectric material such as oxide, nitride, oxynitride, or other dielectric material or various combinations thereof. The process for forming the spacers 235a and 235b may comprise, for example, forming a substantially conformal dielectric layer (provided for forming the spacers 235a and 235b) over the top electrode 220a, the gate 220b and the substrate 200 by a chemical vapor deposition (CVD) process. An etch process such as an etch-back process is applied to remove a portion of the dielectric layer (not shown) so as to form the spacers 235a and 235b.

Referring again to FIG. 2F, an ion implantation process 240 is conducted to form conductive regions 243 within the substrate 200 near to the spacers 235b. In some embodiments, the ion implantation process 240 is referred to as a source/drain (S/D) implantation. The ion implantation process 240 may increase the dopant concentration within the top electrode 220a and the conductive region 225c, which are not covered by the top electrode 220a. Accordingly, the conductivity of the top electrode 220a and the conductive region 225c may be desirably increased. The dopant concentration within the region 225b covered by the top electrode 220a may be substantially equal to the dopant concentration of the region 225 (shown in FIG. 2D).

Figure 2G:
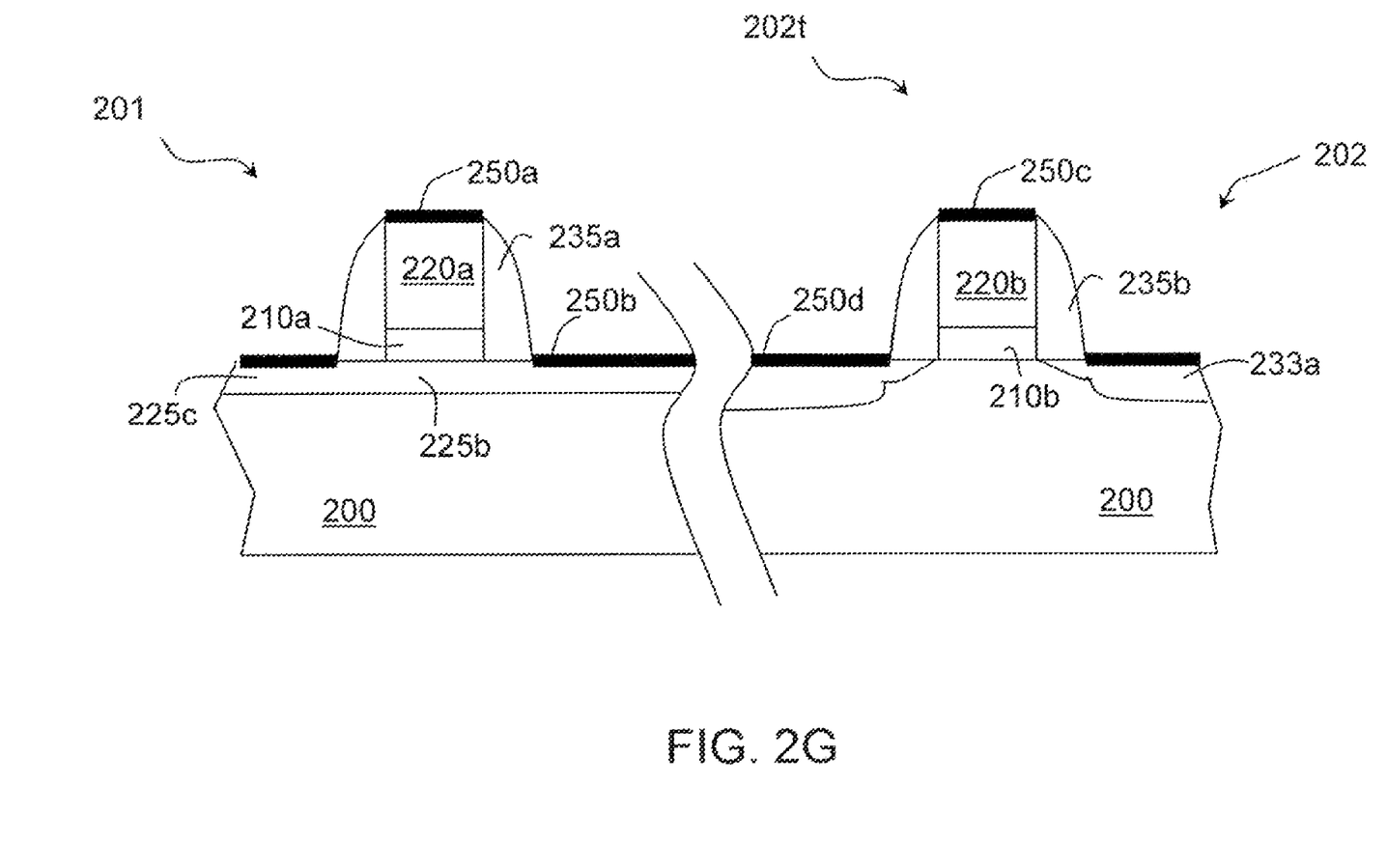

Referring to FIG. 2G, silicide layers 250a, 250b, 250c and 250d are formed on the top electrode 220a, the exposed surfaces of the conductive regions 225c, the gate 220b and the exposed surfaces of the S/D regions 243, respectively. The silicide layers 250a, 250b, 250c and 250d may include at least one metallic silicide material such as tungsten silicide ($WSi_x$), titanium silicide ($TiSi_x$), nickel silicide ($NSi_x$), cobalt silicide ($CoSi_x$) or other metallic silicide. In some embodiments, the transistor 202t formed within the transistor region 202 is referred to as a core metal-oxide-semiconductor (MOS) transistor or an input/output (I/O) MOS transistor.

Figure 2H:
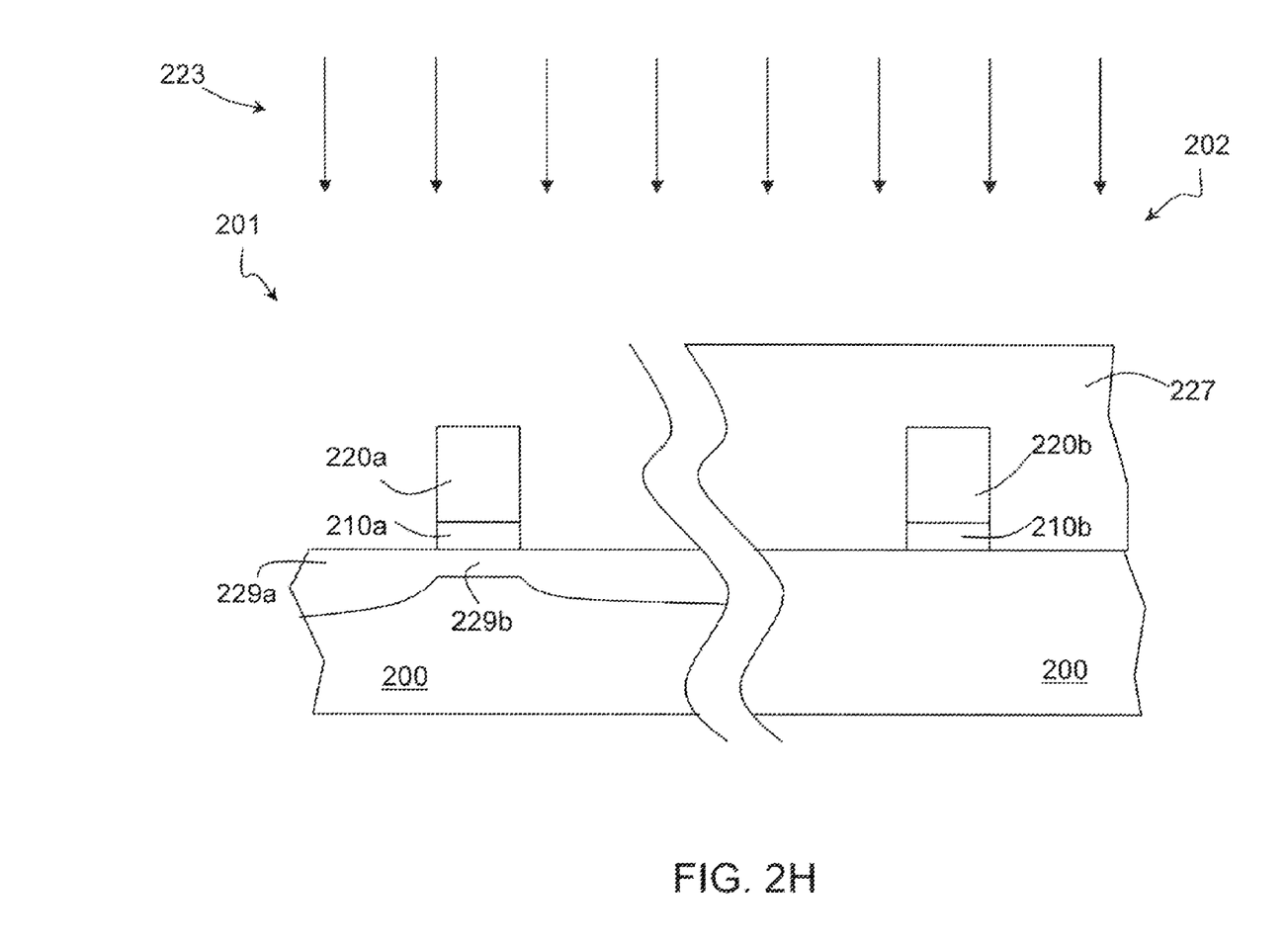
FIGS. 2H-2I are schematic cross-sectional views showing exemplary implantation processes.

In some embodiments, the ion implantation process 233 is conducted after patterning the conductive layer 220 and the dielectric layer 210 (shown in FIG. 2D). Referring to FIG. 2H, after forming the top electrode 220a, the gate 220b and the dielectric layers 210a and 210b, a patterned photoresist layer 227 is formed over the gate 220b, at least partially covering the transistor region 202 and at least partially exposing the capacitor region 201, i.e., the patterned photoresist layer 227 covers the gate 220b and exposes the top electrode 220a. After the formation of the patterned photoresist layer 227, the ion implantation process 223 is conducted so as to form the doped regions 229a and 229b. Since the doped region 229b is covered by the top electrode 220a, the dopant depth of the doped region 229b may be shallower than that of the doped regions 229a.

Figure 2I:
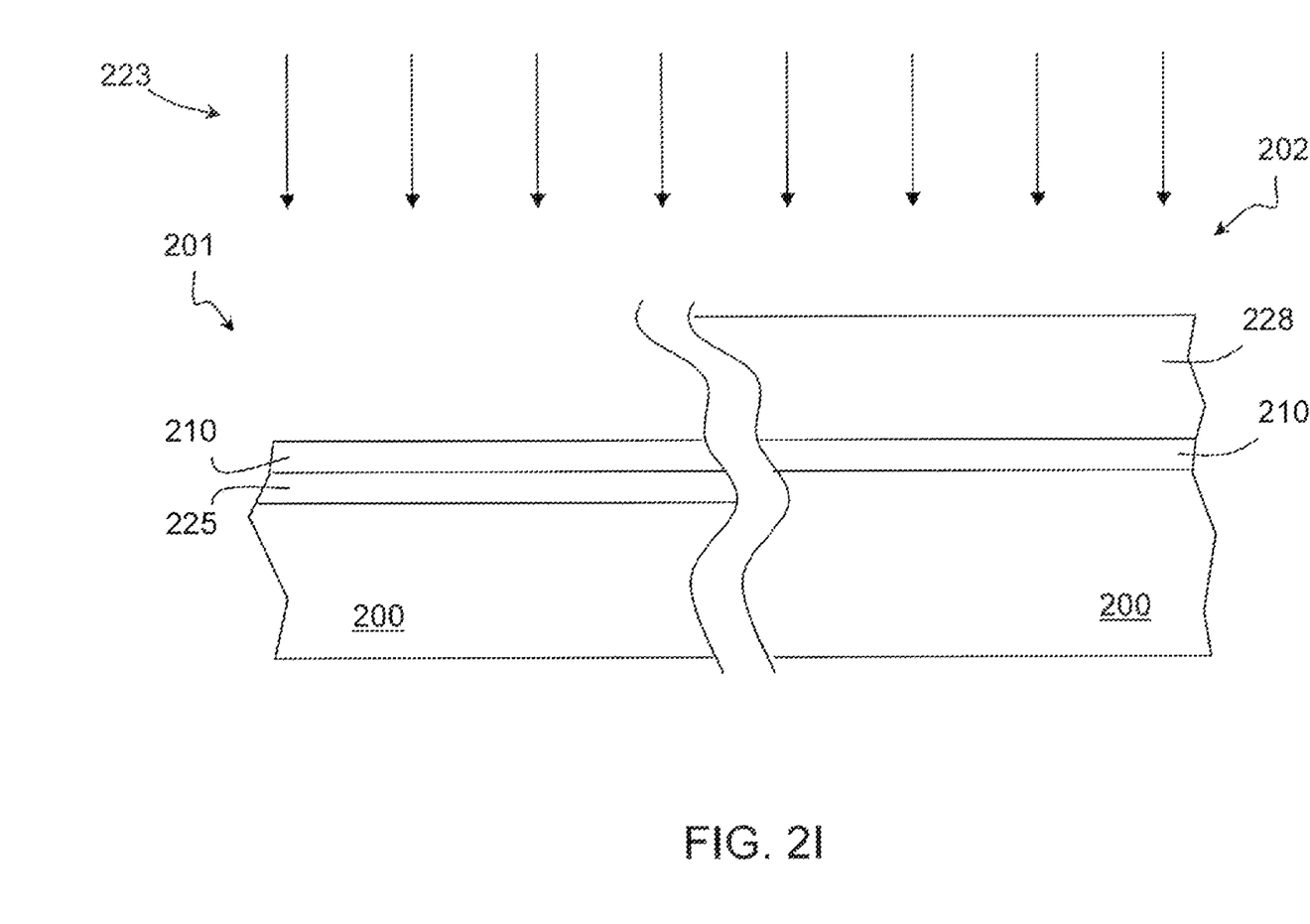

In some embodiments, the ion implantation process 233 is conducted after forming the dielectric layer 210 and before the formation of the conductive layer 220 as shown in FIG. 2I. Referring to FIG. 2I, after forming the dielectric layer 210, a patterned photoresist layer 228 is formed over the dielectric layer 210, at least partially covering the transistor region 202 and at least partially exposing the capacitor region 201. After the formation of the patterned photoresist layer 228, the ion implantation process 223 is conducted so as to form the conductive region 225.

Figure 3:
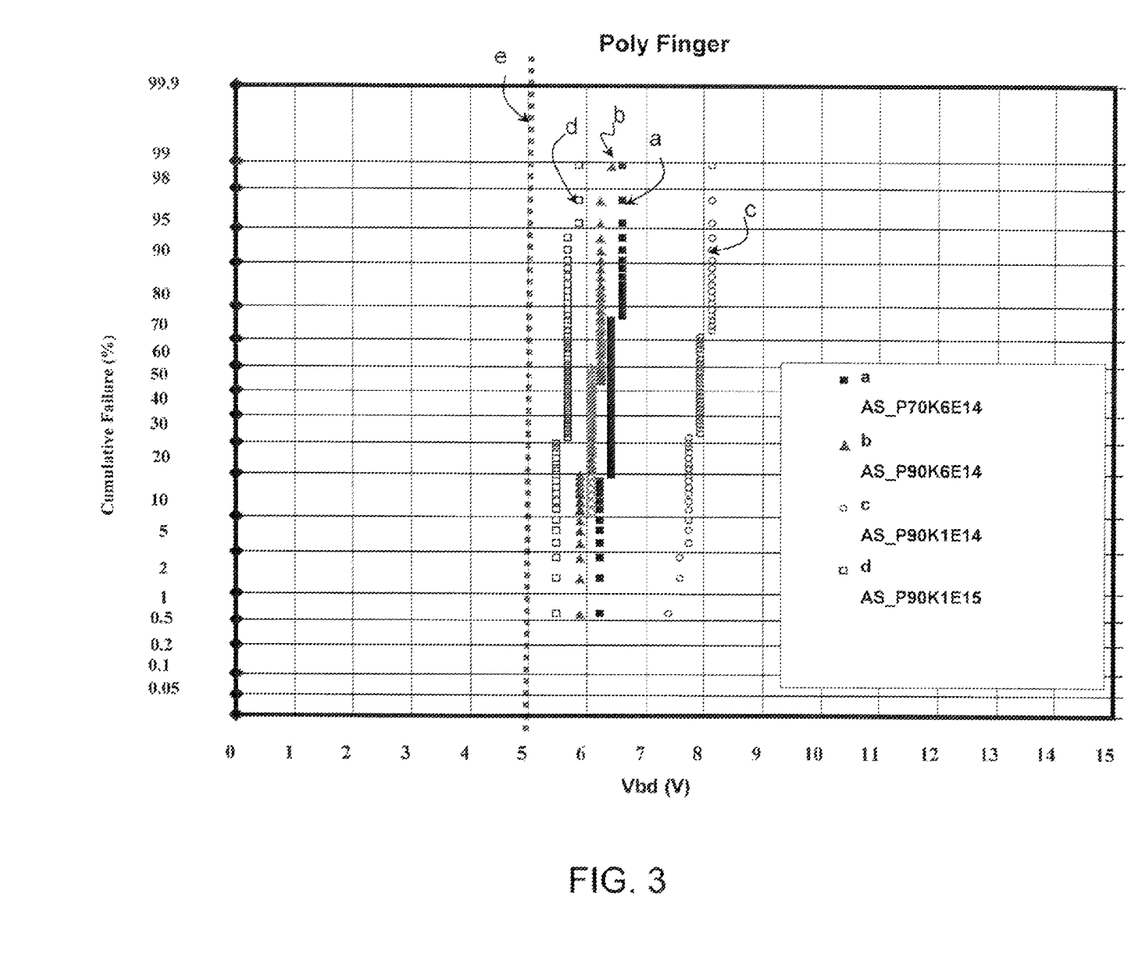
FIG. 3 is a graph showing dielectric layer breakdown voltages of exemplary capacitors with poly finger structures.

FIG. 3 is a graph showing dielectric layer breakdown voltages of exemplary capacitors with poly finger structures. In FIG. 3, the horizontal axis represents the breakdown voltage ($V_{bd}$) of the dielectric layer, and the vertical axis represents the cumulative failure rate (%). In FIG. 3, data "a" represent the breakdown voltage of the dielectric layer 210a (shown in FIG. 2G) of an exemplary capacitor formed by the ion implantation process 223 (shown in FIG. 2C) using phosphorus and having an implantation energy of about 70 KeV and an implantation dosage of about $6 \times 10^{14}/cm^2$; data "b" represent the breakdown voltage of the dielectric layer 210a (shown in FIG. 2G) of an exemplary capacitor formed by the ion implantation process 223 (shown in FIG. 2C) using phosphorus and having an implantation energy of about 90 KeV and an implantation dosage of about $6 \times 10^{14}/cm^2$; data "c" represent breakdown voltage of the dielectric layer 210a (shown in FIG. 2G) of an exemplary capacitor formed by the ion implantation process 223 (shown in FIG. 2C) using phosphorus and having an implantation energy of about 90 KeV and an implantation dosage of about $1 \times 10^{14}/cm^2$; data "d" represent breakdown voltage of the dielectric layer 210a (shown in FIG. 2G) of an exemplary capacitor formed by the ion implantation process 223 (shown in FIG. 2C) using phosphorus and having an implantation energy of about 90 KeV and an implantation dosage of about $1 \times 10^{15}/cm^2$; and the dotted line "e" represents a pre-defined and desired breakdown voltage of the dielectric layer.

Referring again to FIG. 3, the breakdown voltages of the dielectric layer of the exemplary capacitors formed by the ion implantation processes a-d are over the pre-defined breakdown voltage represented by the dotted line "e." Accordingly, using the processes described in conjunction with FIGS. 2A-2I may achieve desired breakdown voltages of the dielectric layer 210a of the exemplary capacitor.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method for forming a capacitor, comprising:
   forming a dielectric layer over a substrate;
   forming a conductive layer over the dielectric layer; and
   implanting dopants through at least one of the dielectric layer and the conductive layer after forming the dielectric layer and the conductive layer, so as to form a conductive region under the dielectric layer, wherein the conductive layer is a top electrode of the capacitor and the conductive region is a bottom electrode of the capacitor.

2. The method of claim 1 further comprising patterning the dielectric layer and the conductive layer before the implantation step.

3. The method of claim 1, wherein the step of forming a dielectric layer is a step of forming a gate dielectric layer of a core metal-oxide-semiconductor (MOS) transistor or an input/output (I/O) MOS transistor.

4. The method of claim 1, wherein the step of forming a conductive layer is a step of forming a gate layer of a core metal-oxide-semiconductor (MOS) transistor or an input/output (I/O) MOS transistor.

5. The method of claim 1 further comprising performing a lightly-doped drain (LDD) implantation so as to increase a dopant concentration of the conductive layer and to increase a dopant concentration of a part of the conductive region that is not covered by the conductive layer.

6. The method of claim 1 further comprising performing a source/drain (S/D) implantation so as to increase a dopant concentration of the conductive layer and to increase a dopant concentration of a part of the conductive region that is not covered by the conductive layer.

7. The method of claim 1, wherein the step of implanting dopants is separate from a source/drain (S/D) implantation or a LDD implantation of a core metal-oxide-semiconductor (MOS) transistor or an input/output (I/O) MOS transistor.

8. The method of claim 1, wherein the implantation step has an implantation enemy between about 5_KeV and about 200 KeV and an implantation dosage between about $1 \times 10^{14}/cm^2$ and about $1 \times 10^{17}/cm^2$.

9. The method of claim 1, wherein said implanting comprises implanting dopants through both the dielectric layer and the conductive layer.

10. A method for forming a semiconductor structure, comprising:
    forming a dielectric layer in a capacitor region and a transistor region of a substrate;
    forming a conductive layer over the dielectric layer;
    forming a photoresist layer covering a first region of the conductive layer in the transistor region and exposing a second region of the conductive layer in the capacitor region;
    implanting dopants within the second region of the conductive layer not covered by the photoresist layer so as to form a bottom electrode; and
    patterning the dielectric layer and the conductive layer so as to form a top electrode and a capacitor dielectric layer in the capacitor region and a gate and a gate dielectric layer in the transistor region.

11. The method of claim 10, wherein the step of forming a dielectric layer is a step of forming a gate dielectric layer of a core metal-oxide-semiconductor (MOS) transistor or an input/output (I/O) MOS transistor.

12. The method of claim 10, wherein the step of forming a conductive layer is a step of forming a gate layer of a core metal-oxide-semiconductor (MOS) transistor or an input/output (I/O) MOS transistor.

13. The method of claim 10 further comprising performing a lightly-doped drain (LOD) implantation so as to increase a dopant concentration of the top electrode and to increase a dopant concentration of a part of the bottom electrode that is not covered by the top electrode.

14. The method of claim 10 further comprising performing a source/drain (S/D) implantation so as to increase a dopant concentration of the top electrode and to increase a dopant concentration of a part of the bottom electrode that is not covered by the top electrode.

15. The method of claim 10, wherein the implantation step has an implantation energy between about 5 KeV and about 200 KeV and an implantation dosage between about $1 \times 10^{14}/cm^2$ and about $1 \times 10^{17}/cm^2$.

16. A method for forming a capacitor, comprising:
   forming a dielectric layer over a substrate;
   forming a conductive layer over the dielectric layer;
   implanting dopants through the dielectric layer and the conductive layer so as to form a conductive region under the dielectric layer; and
   patterning the dielectric layer and the conductive layer so as to form a capacitor dielectric layer and a top electrode.

17. The method of claim 16, wherein the step of forming a dielectric layer is a step of forming a gate dielectric layer of a core metal-oxide-semiconductor (MOS) transistor or an input/output (I/O) MOS transistor.

18. The method of claim 16, wherein the step of forming a conductive layer is a step of forming a gate layer of a core metal-oxide-semiconductor (MOS) transistor or an input/output (I/O) MOS transistor.

19. The method of claim 16, wherein the implantation step has an implantation energy between about 5 KeV and about 200 KeV and an implantation dosage between about $1 \times 10^{14}/cm^2$ and about $1 \times 10^{17}/cm^2$.

20. The method of claim 16, wherein said forming a conductive layer comprises forming a metallic layer.

* * * * *

UNITED STATES PATENT AND TRADEMARK OFFICE
CERTIFICATE OF CORRECTION

PATENT NO. : 7,521,330 B2  Page 1 of 1
APPLICATION NO. : 11/757763
DATED : April 21, 2009
INVENTOR(S) : Chun Chieh Wu et al.

It is certified that error appears in the above-identified patent and that said Letters Patent is hereby corrected as shown below:

Column 1, line 64, replace "2H-21" with --2H-2I--
Column 2, line 27, replace "Ill" with --III--
Column 5, line 20, replace "21" with --2I--
Column 6, line 38, replace "enemy" with --energy--
Column 7, line 2, replace "LOD" with --LDD--

Signed and Sealed this

Thirteenth Day of October, 2009

David J. Kappos
*Director of the United States Patent and Trademark Office*